(12) United States Patent
Zini et al.

(10) Patent No.: US 9,923,130 B2
(45) Date of Patent: Mar. 20, 2018

(54) OPTOELECTRONIC SEMICONDUCTOR DEVICE AND METHOD FOR PRODUCING AN OPTOELECTRONIC SEMICONDUCTOR DEVICE

(71) Applicant: OSRAM Opto Semiconductors GmbH, Regensburg (DE)

(72) Inventors: Lorenzo Zini, Regensburg (DE); Tobias Meyer, Ihrlerstein (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/773,805

(22) PCT Filed: Mar. 7, 2014

(86) PCT No.: PCT/EP2014/054479
§ 371 (c)(1),
(2) Date: Sep. 9, 2015

(87) PCT Pub. No.: WO2014/139893
PCT Pub. Date: Sep. 18, 2014

(65) Prior Publication Data
US 2016/0027976 A1 Jan. 28, 2016

(30) Foreign Application Priority Data
Mar. 14, 2013 (DE) .................. 10 2013 102 621

(51) Int. Cl.
*H01L 33/58* (2010.01)
*H01L 33/44* (2010.01)
*H01L 33/32* (2010.01)
*H01L 33/50* (2010.01)
*H01L 33/62* (2010.01)
*H01L 33/46* (2010.01)
*H01L 33/60* (2010.01)

(52) U.S. Cl.
CPC .............. *H01L 33/58* (2013.01); *H01L 33/32* (2013.01); *H01L 33/44* (2013.01); *H01L 33/505* (2013.01);
(Continued)

(58) Field of Classification Search
CPC ................................ H01L 33/34; H01L 33/46
(Continued)

(56) References Cited

U.S. PATENT DOCUMENTS 8,148,734 B2   2/2012   Kim
8,723,192 B2   5/2014   Weidner et al.
(Continued)

FOREIGN PATENT DOCUMENTS

CN   101043059 A   9/2007
CN   101075652 A   11/2007
(Continued)

*Primary Examiner* — Bo Fan
(74) *Attorney, Agent, or Firm* — Slater Matsil, LLP

(57) ABSTRACT

An optoelectronic semiconductor component has at least one semiconductor chip for emitting electromagnetic radiation. The semiconductor chip has at least one side surface and wherein a part of the electromagnetic radiation exits through the side surface during operation of the semiconductor chip. The semiconductor component additionally has at least one deflecting element that is formed to be transmissive to radiation. The deflecting element and the semiconductor chip are arranged one alongside another. The deflecting element is arranged at the side surface of the semiconductor chip. The deflecting element has a material, the index of refraction of which is greater than an average index of refraction of a semiconductor material of the semiconductor chip.

19 Claims, 2 Drawing Sheets

(52) U.S. Cl.
CPC .............. *H01L 33/62* (2013.01); *H01L 33/46* (2013.01); *H01L 33/60* (2013.01); *H01L 2933/0058* (2013.01); *H01L 2933/0066* (2013.01)

(58) Field of Classification Search
USPC ........................................ 257/76, 79, 85, 98
See application file for complete search history.

(56) References Cited

U.S. PATENT DOCUMENTS

| | | |
|---|---|---|
| 9,293,671 B2 | 3/2016 | Brunner et al. |
| 2003/0025212 A1 | 2/2003 | Bhat et al. |
| 2006/0278886 A1* | 12/2006 | Tomoda .................. H01L 33/20 257/99 |
| 2011/0297914 A1 | 12/2011 | Zheng et al. |
| 2012/0049219 A1 | 3/2012 | Kamiya et al. |
| 2012/0319575 A1 | 12/2012 | Nakamura et al. |

FOREIGN PATENT DOCUMENTS

| | | |
|---|---|---|
| CN | 101212004 A | 7/2008 |
| CN | 101226977 A | 7/2008 |
| CN | 102859729 A | 1/2013 |
| JP | 2002050800 A | 2/2002 |
| JP | 2008277592 A | 11/2008 |
| JP | 2013012545 A | 1/2013 |
| JP | 2013021314 | 1/2013 |
| WO | 2006117710 A1 | 11/2006 |
| WO | 2011015449 A1 | 2/2011 |

* cited by examiner

OPTOELECTRONIC SEMICONDUCTOR DEVICE AND METHOD FOR PRODUCING AN OPTOELECTRONIC SEMICONDUCTOR DEVICE

This patent application is a national phase filing under section 371 of PCT/EP2014/054479, filed Mar. 7, 2014, which claims the priority of German patent application 10 2013 102 621.4, filed Mar. 14, 2013, each of which is incorporated herein by reference in its entirety.

TECHNICAL FIELD

An optoelectronic semiconductor device is provided. A method for producing an optoelectronic semiconductor device is also provided.

BACKGROUND

International Patent Publication WO 2011/015449 A1 and U.S. Pat. No. 8,148,734 B2 describe an optoelectronic semiconductor device.

SUMMARY

Embodiments of the present application provide an optoelectronic semiconductor device, "device" for short, which is particularly efficient and in particular has a particularly high light outcoupling property. Further embodiments provide a simple method for producing a particularly efficient optoelectronic semiconductor device.

According to one aspect, an optoelectronic semiconductor device, "device" for short, is provided. The device is configured to emit electromagnetic radiation, preferably light. In operation, the device emits infrared radiation, UV radiation, colored light or white light.

The device comprises at least one semiconductor chip. The device can also comprise more than one semiconductor chip, e.g., two or more semiconductor chips.

The semiconductor chip is preferably a semiconductor chip based on a III-V semiconductor material, in particular a nitride compound semiconductor material or a phosphide compound semiconductor material or an arsenide compound semiconductor material. Preferably, the semiconductor chip is a light-emitting diode (LED) chip.

The semiconductor chip has, for example, a small thickness, i.e., a low vertical extent. Preferably, the substrate-less semiconductor chip has a thickness of less than 15 µm, preferably less than 7 µm, e.g., 5 µm or 6 µm.

The semiconductor chip can be, for example, a thin-film chip in which a growth substrate is removed. The semiconductor chip is then a surface emitter in which a majority of the radiation exiting the chip exits through a major surface of the semiconductor chip.

Furthermore, the semiconductor chip can be a semiconductor chip having a growth substrate, in particular having a radiation-transmissive sapphire substrate. In this case, the semiconductor chip can be a volume emitter in which a considerable portion of the exiting radiation exits through lateral surfaces extending perpendicularly or transversely with respect to the major surfaces of the chip.

The semiconductor chip comprises an active zone to generate electromagnetic radiation, in particular light. The semiconductor chip preferably has a main emission direction which extends, for example, perpendicularly with respect to an emission surface of the semiconductor chip. More than 50% of the generated radiation, preferably more than 70% of the radiation generated by the semiconductor chip is emitted in the main emission direction. This definition of the main emission direction relates in particular to semiconductor chips which are surface emitters.

Furthermore, it is possible that the main emission direction is defined by the direction extending in parallel with the growth direction of the epitaxially deposited layers of the semiconductor chip irrespective of which portion of the radiation is emitted in this direction. This definition of the main emission direction relates in particular to semiconductor chips which are volume emitters.

The semiconductor chip comprises at least one lateral surface. The lateral surface preferably extends circumferentially around the semiconductor chip and delimits same in the lateral directions. The lateral surface extends transversely or perpendicularly with respect to a lateral main extension direction of the device or of the semiconductor chip. The semiconductor chip also has a top side and a bottom side. The top and bottom sides extend transversely or perpendicularly with respect to the lateral surface of the semiconductor chip. The top and bottom sides extend in parallel with the lateral main extension direction of the device or of the semiconductor chip.

The device can further comprise a carrier. The semiconductor chip is then arranged on the carrier. In particular, the bottom side of the semiconductor chip is attached, e.g., soldered, to the carrier. The carrier is used to mechanically stabilize the semiconductor chip.

A portion of the electromagnetic radiation generated by the semiconductor chip exits through the lateral surface of the semiconductor chip during operation thereof. In other words, a portion of the radiation is not emitted in the main emission direction perpendicularly with respect to the lateral main extension direction. For example, up to 50% of the generated radiation exits through the lateral surface. Preferably, 20% to 30%, e.g., 25%, of the radiation emitted by the semiconductor chip during operation exits through the lateral surface of the semiconductor chip. The remaining portion of the radiation, i.e., preferably up to 80% of the radiation, e.g., 60% or 70% of the radiation emitted by the semiconductor chip during operation, exits through the top side of the semiconductor chip.

The device further comprises at least one deflecting element. The deflecting element is preferably formed in one piece. The deflecting element can be formed from a homogeneous material. In other words, the mechanical, electrical and/or optical properties, in particular the refractive index, of the material of the deflecting element are identical at different locations of the deflecting element. In particular, it is then possible that the deflecting element does not have a layer structure. In this embodiment, the deflecting element is therefore not formed, for example, with layers having different refractive indices but rather is formed, for example, by a single, thick layer of an homogeneous material.

The deflecting element can be formed as a deflecting layer. In particular, a lateral extent of the deflecting element is preferably smaller than a lateral extent of the semiconductor chip. A vertical extent of the deflecting element corresponds approximately or precisely to the vertical extent of the semiconductor chip. The deflecting element is configured to deflect the radiation generated by the semiconductor chip which exits from the lateral surface of the semiconductor chip. The deflecting element covers, for example, completely, the lateral surfaces of the semiconductor chip.

The deflecting element is formed to be radiation-transmissive. In particular, the deflecting element is configured such that the radiation exiting laterally from the semiconductor chip, which radiation is generated in the semiconductor chip during operation, can pass through the deflecting element completely or at least partially. The deflecting element and the semiconductor chip are arranged next to each other. The deflecting element is arranged on the lateral surface of the semiconductor chip. The deflecting element can only be arranged on one part of the lateral surface of the semiconductor chip. However, as an alternative thereto, the deflecting element can also be arranged on the complete lateral surface of the semiconductor chip. In other words, the deflecting element can be arranged circumferentially around the semiconductor chip. In this case, the deflecting element is preferably formed in a frame-like manner.

The deflecting element comprises a material whose refractive index is greater than an average refractive index of the semiconductor material of the semiconductor chip adjoined by the deflecting element. For example, the average refractive index of the material of the deflecting element at a predetermined wavelength of the generated radiation (e.g., at 450 nm) is 2%, particularly 10%, greater than the average refractive index of the semiconductor material of the semiconductor chip. Preferably, the average refractive index of the material of the deflecting element at a predetermined wavelength is more than 10%, e.g., 15% or 20%, greater than the average refractive index of the semiconductor material of the semiconductor chip.

By reason of the high refractive index of the deflecting element and the thus associated refractive index jump between the semiconductor and deflecting element, a portion of the radiation generated by the semiconductor chip exiting at the lateral surface of the semiconductor chip is deflected by the deflecting element in the direction of the main emission direction of the semiconductor chip. A portion of the radiation impinging upon a lateral surface of the deflecting element is totally reflected and is deflected in the direction of the main emission direction of the semiconductor chip.

In the event that total reflection does not occur, that is to say in the event that the angle of incidence of the laterally exiting radiation is less than the critical angle for total reflection, it is further possible that the reflection probability of the laterally exiting radiation is increased at the lateral surface. In other words, the deflecting element can be used to increase the probability for deflecting the radiation, which leaves the semiconductor chip through the lateral surface thereof, in the direction of the main emission direction irrespective of the angle of incidence of the laterally exiting radiation. The angle of incidence can be produced hereby and hereinafter by the angle at which the radiation impinges upon a point of the lateral surface of the semiconductor chip and/or of the deflecting element in relation to a tangent normal to the lateral surface of the semiconductor chip and/or of the deflecting element through this point. For angles of incidence which are less than the critical angle for total reflection at the respective lateral surface, the radiation is only partially reflected. The degree of this reflection can be increased by attaching the deflecting element.

The lateral surfaces of the deflecting element extend, for example, in parallel with the lateral surfaces of the semiconductor chip at the side of the deflecting element facing away from the semiconductor chip. Radiation losses through radiation leaving the semiconductor chip through the lateral surface can thus be reduced or completely avoided. The light outcoupling property of the device is thereby increased. Therefore, a very efficient device is made available.

According to at least one embodiment, the deflecting element comprises a first lateral surface facing the lateral surface of the semiconductor chip. The deflecting element further comprises a second lateral surface arranged opposite to the first lateral surface. The first lateral surface and the second lateral surface are arranged in parallel with each other. The first lateral surface and second lateral surface extend perpendicularly with respect to the main extension direction of the device.

The first lateral surface of the deflecting element forms a radiation entry surface. In particular, the semiconductor chip and/or the deflecting element is/are formed such that the portion of the radiation exiting the lateral surface of the semiconductor chip enters the deflecting element via the first lateral surface of the deflecting element.

The first lateral surface or the radiation entry surface is a boundary surface between the semiconductor chip and the deflecting element. The radiation entry surface or first lateral surface is preferably flat or planar. The radiation entry surface is preferably arranged in parallel with and opposite to the lateral surface of the semiconductor chip. The second lateral surface of the deflecting element is also preferably flat or planar.

The deflecting element is formed and arranged such that the radiation which has entered the deflecting element is completely or partially prevented from exiting the second lateral surface of the deflecting element. For example, less than 10%, e.g., 5% or 2%, of the radiation which has entered the deflecting element then exits at the second lateral surface of the deflecting element. Preferably, a majority of the radiation which has entered the deflecting element, e.g., 90% or more, is totally reflected at the second lateral surface of the deflecting element. In a particularly preferred manner, 95% or more, e.g., 98% or 99%, of the radiation entering the deflecting element is totally reflected at the second lateral surface. In addition, silvering can be provided on the second lateral surface of the deflecting element, wherein this can be, for example, a reflective metal layer which is particularly directly applied onto the deflecting element at the second lateral surface.

In this context, total reflection is understood to mean that the angle, at which the radiation impinges upon a point of the second lateral surface, in relation to a tangent normal through this point is greater than the critical angle for total reflection in the respective surrounding medium at this point. For measuring this critical angle, the tangent normal in the point is decisive in each case.

By reason of the high refractive index of the material of the deflecting element and the planar configuration of the second lateral surface, the radiation is thus prevented, to a considerable or complete extent, from laterally exiting the deflecting element. As a result, it is possible that the radiation which has exited the lateral surface of the semiconductor chip and has entered the deflecting element cannot, or barely cannot, be laterally lost.

According to at least one embodiment, the deflecting element comprises a top side facing away from a carrier. The top side extends perpendicularly or transversely with respect to the first and second lateral surface of the deflecting element. The top side extends substantially in parallel with the lateral main extension direction of the device.

The deflecting element is formed and arranged such that the radiation which is emitted by the semiconductor chip and has entered the deflecting element is outcoupled at the top side of the deflecting element. For example, the top side of the deflecting element has a structuring for this purpose. The structuring of the top side is used to facilitate the outcoupling of the radiation in the forward direction. The top side of the deflecting element can be roughened, for example. For this purpose, the top side of the deflecting element can be etched, brushed, ground or sand-blasted. In particular, the lateral surfaces of the deflecting element are formed smoother than the top side.

By specifically configuring the lateral surfaces and the surface of the deflecting element, the radiation totally reflected at the second lateral surface of the deflecting element is deflected upwards to the top side of the deflecting element and at that location is outcoupled from the deflecting element. In other words, the radiation is outcoupled from the deflecting element in the main emission direction of the semiconductor chip. Preferably, 90% or more of the totally reflected radiation, in a particularly preferred manner more than 95%, e.g., 98%, of the totally reflected radiation is outcoupled at the top side of the deflecting element. Therefore, the luminous efficiency of the device is increased. Radiation losses owing to radiation exiting laterally from the semiconductor chip and/or the deflecting element are avoided.

According to at least one embodiment, the semiconductor chip comprises a top side facing away from a carrier. The semiconductor chip is formed such that a further portion of the radiation emitted by the semiconductor chip, in particular the radiation emitted by the semiconductor chip in the main emission direction, is outcoupled at the top side of the semiconductor chip. Preferably, the top side of the semiconductor chip has a structuring. The top side of the semiconductor chip can be roughened, for example, by means of etching, brushing, grinding or sand-blasting. The top side is particularly rougher than the bottom side and the lateral surface of the semiconductor chip.

Preferably, 80%, 90% or more, particularly preferably 95%, 98% or 99% of the radiation which does not exit through the lateral surface of the semiconductor chip is coupled out of the semiconductor chip at the top side thereof. As a result, a particularly efficient device is provided.

According to at least one embodiment, the device comprises at least one wavelength conversion element. The wavelength conversion element is configured for at least partially converting the radiation exiting the top side of the semiconductor chip into an electromagnetic secondary radiation. Furthermore, the wavelength conversion element is configured and arranged for at least partially converting the radiation exiting the top side of the deflecting element into an electromagnetic secondary radiation.

The wavelength conversion element is arranged downstream of the deflecting element and the semiconductor chip in the emission direction. The wavelength conversion element can be arranged at a spaced disposition with respect to the deflecting element and the semiconductor chip. However, as an alternative thereto, the wavelength conversion element can also be arranged directly or immediately adjacent the deflecting element and the semiconductor chip.

A lateral extent of the wavelength conversion element preferably corresponds to an entire lateral extent of the deflecting element and semiconductor chip together. Therefore, all of the radiation exiting the top side of the deflecting element and the top side of the semiconductor chip can impinge upon the wavelength conversion element and can be converted thereby into the secondary radiation.

By virtue of the fact that the radiation which is emitted by the semiconductor chip and has exited through the lateral surface is guided upwards to the top side using the deflecting element, light, which would normally have been laterally lost, can also contribute to the conversion. Additional wavelength conversion elements arranged as an extension of the lateral surface of the semiconductor chip are superfluous.

According to at least one embodiment, the deflecting element is arranged immediately adjacent the lateral surface of the semiconductor chip. In other words, the first lateral surface of the deflecting element is arranged directly adjacent the lateral surface of the semiconductor chip. In this case, no compound material and preferably also no air gap is located between the deflecting element and the semiconductor chip. Radiation losses owing to boundary surface refraction can thus be avoided and the structure of the device can be kept extremely simple.

According to at least one embodiment, a connection layer is arranged between the deflecting element and the semiconductor chip. In this case, the first lateral surface of the deflecting element directly adjoins the connecting layer. Furthermore, the lateral surface of the semiconductor chip also directly adjoins the connecting layer. The connecting layer can be, for example, an adhesive layer. The connecting layer is used to fixedly and preferably permanently connect the deflecting element and the semiconductor chip. Therefore, an extremely stable device can be provided.

The connecting layer comprises a material whose refractive index is less than or equal to the refractive index of the material of the semiconductor chip. The connecting layer can be formed with, or consist of, for example, at least one of the following materials: low-refracting silicone rubber, $SiO_2$, AlON, $Al_2O_3$, AlN, SiN, ZnO, $ZrO_2$.

The refractive index of the material of the connecting layer is preferably smaller than the refractive index of the material of the deflecting element. Furthermore, the refractive index of the material of the connecting layer can be greater than, less than or equal to that of the adjoining material of the semiconductor chip. If the refractive index of the connecting layer is approximately equal to the refractive index of the adjoining material of the semiconductor chip, then during the transition of the radiation from the semiconductor chip into the connecting layer, the radiation is not refracted or refracted away from the axis of incidence, owing to the approximately equal refractive index of the materials. During transition of the radiation from the connecting layer into the deflecting element, the radiation is refracted towards the axis of incidence. The angle at which the radiation entering the deflecting element impinges upon the second lateral surface is thereby increased. Therefore, the degree of total reflection at the second lateral surface is increased and the efficiency of the device is further increased. Furthermore, the connecting layer can be used to once more increase the reflection probability at the second lateral surface, even for an angle of incidence which is smaller than the critical angle for total reflection.

According to at least one embodiment, the deflecting element comprises a bottom side facing a carrier. A reflective layer is arranged between the bottom side of the deflecting element and the carrier. The reflective layer is preferably adhered and/or vapour-deposited and/or sputtered onto the carrier and/or the deflecting element. The reflective layer can additionally or alternatively also be located on the second lateral surface of the deflecting element. The reflective layer can then extend, for example, along the entire bottom side and the entire second lateral surface of the deflecting element.

The reflective layer is used to reflect scattered light, which impinges upon the bottom side of the deflecting element, towards the second lateral surface or top side of the deflecting element and thereby increase the luminous efficiency of the device.

According to at least one embodiment, the semiconductor chip comprises gallium nitride (GaN). The deflecting element can comprise, for example, titanium dioxide (TiO$_2$), tellurium dioxide, high-refracting silicone or indium gallium nitride (InGaN).

These materials are characterized by a high mechanical stability. Furthermore, the materials for the deflecting element have an extremely high refractive index which in each case, particularly for a predetermined value for the wavelength of the emitted radiation, is higher than the refractive index of GaN. By reason of the differences in the refractive indices of the materials of the deflecting element and semiconductor chip, lateral outcoupling of the radiation emitted by the semiconductor chip can be reduced or prevented.

According to a further aspect, a method is described for producing an optoelectronic semiconductor device, preferably the optoelectronic semiconductor device described above. In particular, the semiconductor device produced thereby preferably corresponds to the semiconductor device described herein. Accordingly, all of the features disclosed for the device are also disclosed for the method, and vice-versa. The method comprises the following steps:

Initially, a carrier is provided. The carrier is suitable as a support structure for the semiconductor chip and the deflecting element. The carrier is used as a stabilizing element for the semiconductor chip and the deflecting element.

In a further step, the at least one semiconductor chip is provided. The semiconductor chip is preferably an LED chip.

In a further step, the at least one deflecting element is provided. The material of the deflecting element has a higher refractive index than the material of the semiconductor chip.

In a further step, the semiconductor chip and the deflecting element are arranged such that the first lateral surface of the deflecting element faces the lateral surface of the semiconductor chip.

In a further, optional, step, the carrier can then be removed.

In a further step, the wavelength conversion element is arranged downstream of the deflecting element and the semiconductor chip in the emission direction. In other words, the wavelength conversion element is arranged to follow the top side of the deflecting element and semiconductor chip.

By reason of the specific arrangement and configuration of the semiconductor chip and deflecting element, the radiation exiting the lateral surface of the semiconductor chip is deflected by the deflecting element and is coupled out of the deflecting element at the top side thereof. Therefore, a majority of the radiation emitted by the semiconductor chip, preferably more than 90%, in a particularly preferred manner more than 95%, e.g., 98%, of the radiation impinges upon the wavelength conversion element and can therefore contribute to the conversion. Radiation losses are reduced or completely avoided in this manner. Therefore, a particularly efficient device is provided.

According to at least one embodiment, the deflecting element is formed in a frame-like manner. In particular, the deflecting element surrounds the semiconductor chip preferably completely. The semiconductor chip and the deflecting element are fixedly, preferably permanently, connected together.

In order to connect the semiconductor chip and the deflecting element, the semiconductor chip is introduced into the deflecting element in order to produce a form-fitting connection between the deflecting element and the semiconductor chip. It is hereby superfluous to provide connecting materials between the deflecting element and the semiconductor chip. Therefore, the above-described semiconductor device is produced in a simple manner.

As an alternative thereto, in order to connect the semiconductor chip and the deflecting element, the semiconductor chip is introduced into the deflecting element, wherein the connecting layer is arranged between the deflecting element and the semiconductor chip in order to produce a firmly bonded connection between the deflecting element and semiconductor chip. The connecting layer can initially be attached to the first lateral surface of the deflecting element and/or the lateral surface of the semiconductor chip before the semiconductor chip is introduced into the deflecting element. As an alternative thereto, the semiconductor chip can also be introduced into the deflecting element first, and the connecting layer only subsequently arranged, e.g., injection-molded, between the semiconductor chip and deflecting element. In this manner, an extremely stable connection between the semiconductor chip and the deflecting element is produced and therefore an extremely stable device is provided.

Furthermore, it is possible that the deflecting element is produced by means of a lithographic method. The deflecting element is applied during the production of the semiconductor chip by a coating process such as sputtering, CVD or the like and is then structured, for example, together with the radiation exit surface of the semiconductor chip. In this manner, a direct and particularly fixed connection between the deflecting element and the semiconductor chip is produced.

BRIEF DESCRIPTION OF THE DRAWINGS

The device and the method will be explained in more detail hereinafter with the aid of exemplified embodiments and the associated figures.

Figure 1:
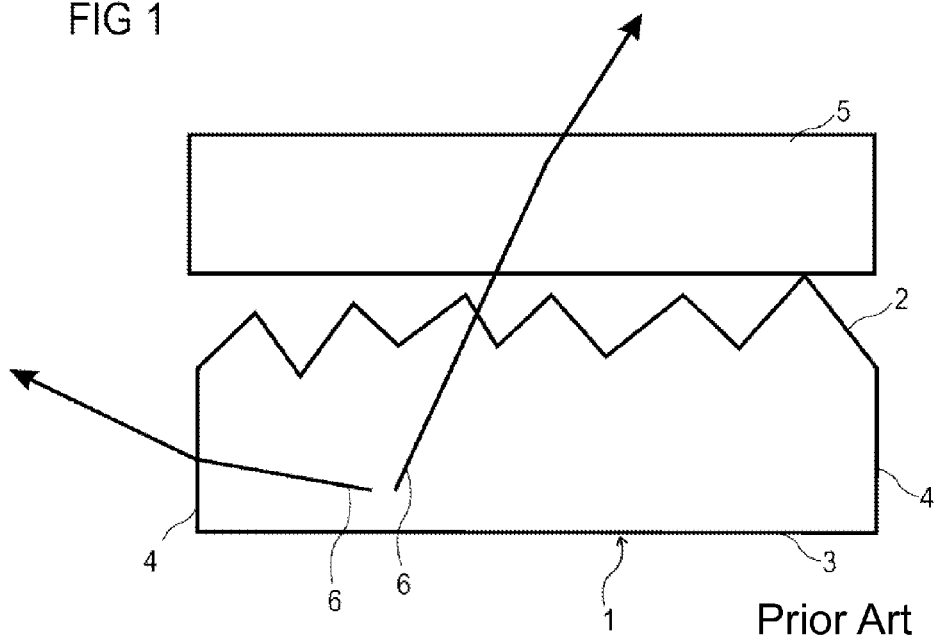
FIG. 1 shows a side view of a device from the prior art.

Identical, similar elements or elements which act in an identical manner are provided with the same reference numerals in the figures. The figures and the size ratios of the elements with respect to each other, as illustrated in the figures, are not to be viewed as being to scale. Rather, individual elements can be illustrated excessively large for improved clarity and/or for improved understanding.

DETAILED DESCRIPTION OF ILLUSTRATIVE EMBODIMENTS

Figure 2:
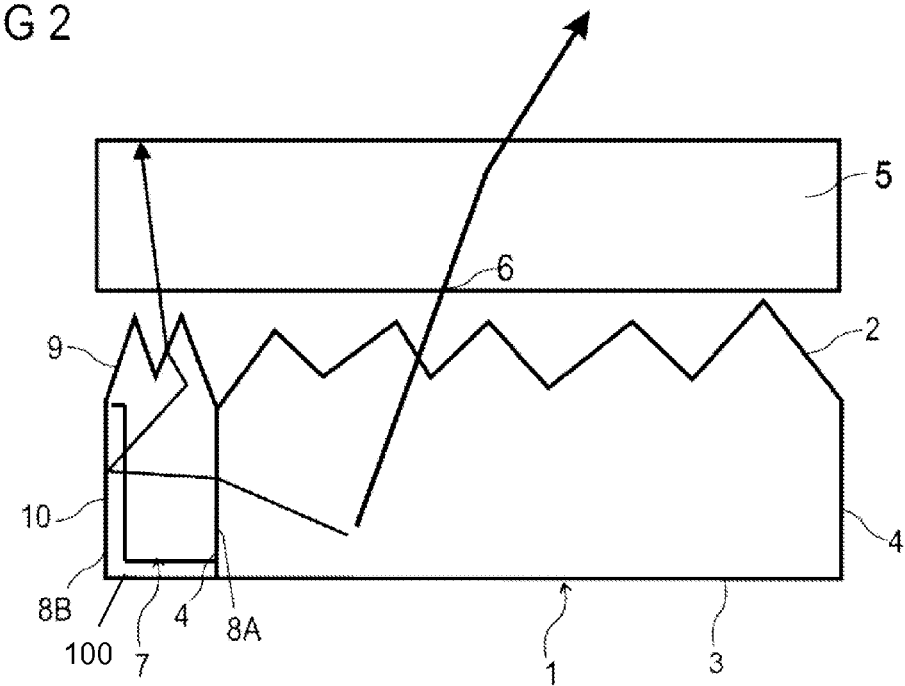
FIG. 2 shows a side view of a device.

FIG. 2 illustrates an optoelectronic semiconductor device, "device" for short. The device comprises a semiconductor chip 1, e.g., an LED chip. The semiconductor chip 1 comprises a semiconductor material, e.g., GaN. The semiconductor chip 1 comprises an active zone (not explicitly illustrated) for emitting electromagnetic radiation 6. The semiconductor chip 1 preferably emits coloured light, e.g., blue light.

The semiconductor chip 1 comprises a lateral surface 4 which extends circumferentially around the semiconductor chip 1. Of course, in this context, it can also be assumed that the semiconductor chip 1 has four lateral surfaces 4, if the respective lateral surface 4 is not considered to be a circumferential surface. The lateral surface 4 extends perpendicularly with respect to the main extension direction of the device or of the semiconductor chip 1.

The semiconductor chip 1 further comprises a top side 2 and a bottom side 3 which are arranged opposite to each other. The top side 2 of the semiconductor chip 1 is that lateral surface of the semiconductor chip in whose direction electromagnetic radiation 6 is primarily or predominantly emitted by the semiconductor chip 1. In other words, the top side 2 is the primary outcoupling surface of the semiconductor chip 1.

The top side 2 is structured, e.g., roughened. This can be achieved by etching, sand-blasting, brushing or grinding the top side 2. The top side 2 is in particular rougher than the bottom side 3 and the lateral surface 4 of the semiconductor chip 1. The structuring is used to improve the outcoupling of light from the semiconductor chip 1. In particular, by reason of the structured top side 2, the radiation 6 can exit the top side 2 of the semiconductor chip 1 more easily.

The semiconductor chip 1 emits predominantly, that is to say at least 50%, preferably 80% or more, e.g., 90%, radiation 6 in the direction of the top side 2 of the semiconductor chip 1. The semiconductor chip 1 further emits a portion of the radiation 6 in the lateral direction, and therefore this portion of the radiation 6 exits through the lateral surface 4 of the semiconductor chip 1. For example, the semiconductor chip 1 laterally emits 50% or less, e.g., 20% or 30%, of the radiation 6. The lateral surface 4 is a secondary outcoupling surface of the semiconductor chip 1.

However, optical elements, e.g., a wavelength conversion element 5, which are arranged downstream of the semiconductor chip 1 in the primary emission direction, cannot be irradiated by the laterally emitted radiation in conventional devices, such as the device illustrated in FIG. 1. In other words, the radiation 6 exiting the lateral surface 4 of the semiconductor chip 1 does not contribute to the conversion in conventional devices.

Only the radiation 6 outcoupled from the top side 2 can contribute to the conversion (see, FIG. 1). In particular, the radiation exiting laterally from the semiconductor chip 1 also does not contribute to the luminous efficiency of a conventional device. This causes a reduced efficiency of the device illustrated in FIG. 1 (prior art).

In order to reduce or prevent radiation losses by reason of the radiation 6 laterally exiting the semiconductor chip 1, the device in FIG. 2 comprises a deflecting element 7. The deflecting element 7 is configured and arranged to deflect the portion of the radiation 6, generated by the semiconductor chip 1, which exits through the lateral surface 4 of the semiconductor chip 1, and in particular to direct it back into the primary emission direction (forward direction) of the semiconductor chip 1. In this manner, the radiation 6 which has laterally exited the semiconductor chip 1 can be deflected to an optical element arranged thereafter (wavelength conversion element 5) and thus contributes to the luminous efficiency of the device.

Figure 3:
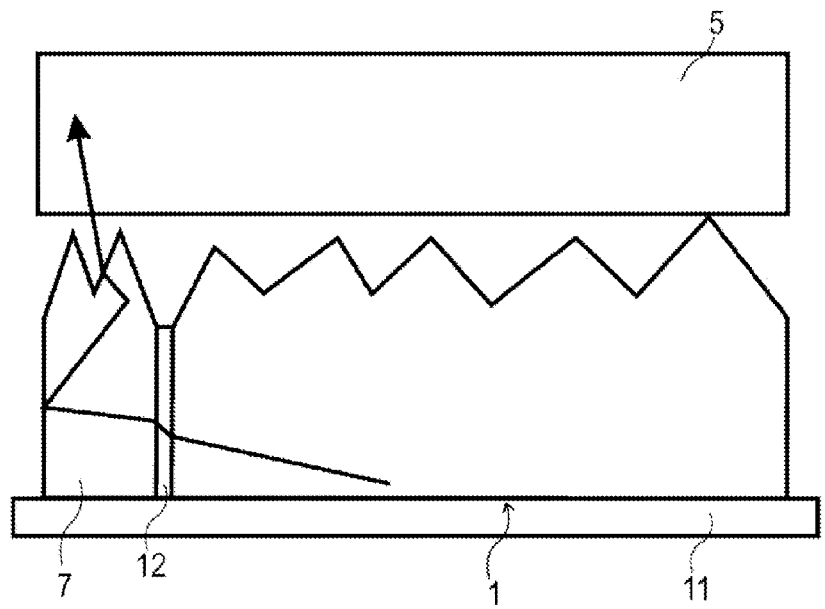
FIG. 3 shows a side view of a device according to a further exemplified embodiment.

The deflecting element 7 and the semiconductor chip 1 can be arranged on a stabilizing carrier 11 (see, FIG. 3). The deflecting element 7 is formed to be at least partially radiation-transmissive. The deflecting element 7 comprises a first lateral surface 8A and a second lateral surface 8B which are arranged opposite to each other. The first and second lateral surfaces 8A, 8B are arranged in parallel with the lateral surface 4 of the semiconductor chip 1. The first and second lateral surfaces 8A, 8B extend perpendicularly with respect to the main extension direction of the device or semiconductor chip 1.

The deflecting element 7 further comprises a top side 9. The top side 9 is formed opposite to the wavelength conversion element 5. The top side 9 has a structuring. The top side 9 is roughened. In particular, the top side 9 is rougher than the lateral surfaces 8A, 8B and than a bottom side of the deflecting element 7. The top side 9 can be sand-blasted, etched, brushed and/or ground.

The deflecting element 7 and the semiconductor chip 1 are arranged next to each other. In this exemplified embodiment, the deflecting element 7 and the semiconductor chip 1 are arranged directly adjacent each other. In other words, the first lateral surface 8A of the deflecting element 7 immediately adjoins the lateral surface of the semiconductor chip 1. In particular, there is no connecting material between the deflecting element 7 and semiconductor chip 1.

The deflecting element 7 is formed in one piece. The deflecting element 7 can only be formed on one part of the lateral surface 4. In particular, in this case, the first lateral surface 8A only adjoins one part of the lateral surface 4 of the semiconductor chip 1. This is expedient particularly for the case when the radiation 6 exits predominantly only at one part of the lateral surface 4 of the semiconductor chip 1.

In an alternative exemplified embodiment (not explicitly illustrated for reasons of clarity), the deflecting element 7 is formed in a frame-like manner. In this exemplified embodiment, the deflecting element 7 is also formed in one piece. In this case, the deflecting element 7 surrounds the semiconductor chip 1 completely. In particular, the semiconductor chip 1 is introduced or inserted into the deflecting element 7. Any radiation exiting the lateral surface 4 of the semiconductor chip 1 can therefore be deflected by the deflecting element 7.

The deflecting element 7 is formed to be high-refracting. In particular, the deflecting element 7 comprises a material whose refractive index is higher than the average refractive index of the material of the semiconductor chip 1. For example, the deflecting element comprises $TiO_2$, $TeO_2$ or InGaN as the material. Each of these materials has, at a predetermined wavelength (e.g., 400 nm) of the emitted radiation 6, a higher refractive index than the material of the semiconductor chip 1, e.g., GaN.

By reason of the high refractive index of the material of the deflecting element 7, the smooth second lateral surface 8B and the structured top side 9, radiation 6 exiting through the lateral surface 4 of the semiconductor chip 1 is deflected by the deflecting element 7 in the forward direction as explained hereinafter:

In particular, the radiation 6 emitted from the lateral surface 4 enters the deflecting element 7 in the first lateral surface 8A thereof. When transitioning from the optically thinner medium (semiconductor chip 1) into the optically denser medium (deflecting element 7), the radiation 6 is refracted towards the axis of incidence. The radiation 6 subsequently then impinges upon the second lateral surface 8B of the deflecting element 7 at a point 10.

The angle at which the radiation 6 impinges upon the point 10 of the second lateral surface 8B of the deflecting element 7 is, in relation to a tangent normal through the point 10, greater than the critical angle for total reflection in the point 10. In other words, the radiation 6 is totally reflected at the point 10 at which the radiation impinges upon the second lateral surface 8B. Preferably, 90% or more of the radiation impinging upon the second lateral surface 8B is totally reflected. The radiation 6 which has entered the deflecting element 7 is thus substantially prevented from exiting at the second lateral surface 8B.

The radiation 6 is reflected at the point 10 in the direction of the top side 9 of the deflecting element 7. By reason of the structuring of the top side 9, a majority of the totally reflected radiation exits the top side 9 of the deflecting element 7. The top side 9 is thus the outcoupling surface of the deflecting element 7. Preferably 90% or more, e.g., 95%, 98% or 99% of the totally reflected radiation exits the top side 9 of the deflecting element 7.

Following on from the bottom side of the deflecting element 7 (i.e., for example, between the deflecting element 7 and the carrier 11), a reflective element or reflective layer 100 can further be arranged. The reflective layer 100 is used to reflect radiation 6 impinging upon the bottom side of the deflecting element 7 and thus direct the radiation in the direction of the top side 9 of the deflecting element 7.

The radiation 6 exiting the top side 9 of the deflecting element 7 can now, just like the radiation 6 emitted from the top side 2 of the semiconductor chip 1, impinge upon a correspondingly configured wavelength conversion element 5 which is arranged downstream of the semiconductor chip 1 in the primary emission direction. The wavelength conversion element 5 is arranged opposite to the top side 2 of the semiconductor chip 1. In order for the radiation 6 exiting the top side 9 of the deflecting element 7 to also be able to impinge upon the wavelength conversion element 5, the wavelength conversion element 5 must also be arranged opposite to the top side 9 of the deflecting element 7. A width or horizontal extent of the wavelength conversion element 5 must consequently correspond approximately to the total width of the semiconductor chip 1 and deflecting element 7, as can be seen in FIG. 2.

By using the deflecting element 7, a majority, e.g., 90%, 95% or 99%, of the radiation 6 generated by the semiconductor chip 1 can contribute to the conversion. Radiation losses by reason of radiation exiting laterally from the semiconductor chip 1 are reduced or completely avoided. As a result, the device in question is particularly efficient.

FIG. 3 shows a side view of a device according to a further exemplified embodiment. In relation to the general features of the device and in particular the semiconductor chip 1 and the deflecting element 7, reference is made extensively to the description in relation to FIG. 2.

In contrast to the exemplified embodiment illustrated in FIG. 2, in the present case the deflecting element 7 does not immediately adjoin the semiconductor chip 1. In particular, the first lateral surface 8A does not directly adjoin the lateral surface 4 of the semiconductor chip 1. Rather, a connecting layer 12 is arranged between the semiconductor chip 1 and the deflecting element 7.

The connecting layer 12 is used to fixedly or permanently connect the deflecting element 7 to the semiconductor chip 1. The connecting layer 12 can be, for example, an adhesive layer which is formed between the deflecting element 7 and the semiconductor chip 1.

The connecting layer 12 comprises a material whose refractive index is less than or equal to the refractive index of the material of the semiconductor chip 1 (e.g., GaN). Furthermore, the refractive index of the material of the connecting layer 12 is less than the refractive index of the material of the deflecting element 7, and therefore the radiation 6, upon entering the deflecting element 7, again transitions from an optically thinner medium into an optically denser medium, as was already the case in the device of FIG. 2.

When the radiation transitions from the semiconductor chip 1 into the connecting layer 12, the radiation, owing to the identical refractive index of the materials or owing to the smaller refractive index of the connecting layer 12, is not refracted or, if at all, is refracted away from the axis of incidence. When the radiation transitions from the connecting layer 12 into the deflecting element 7, the radiation 6 is then refracted towards the axis of incidence during the transition into the optically denser medium. The angle at which the radiation 6 entering the deflecting element 7 then impinges upon the second lateral surface 8B at the point 10 is increased by the connecting layer 12 arranged between the deflecting element 7 and semiconductor chip 1. The degree of total reflection at the point 10 on the second lateral surface 8B is thus increased and as a result the efficiency of the device is increased. It is further possible that the reflection probability at the second lateral surface is increased.

The above-described device is produced as follows (in this respect, see in particular FIGS. 2 and 3):

In a first step, the previously mentioned carrier is provided. The carrier 11 is used to mechanically stabilize the semiconductor chip 1 and deflecting element 7. The carrier 11 can then subsequently be removed.

In a further step, the above-described semiconductor chip 1 is provided. In a next step, the above-described deflecting element 7 is provided.

In a next step, the above-described wavelength conversion element 5 is provided. The wavelength conversion element 5 is configured to at least partially convert the radiation 6 emitted by the semiconductor chip 1 and deflecting element 7 into a further radiation having a wavelength different from that of the emitted radiation 6.

Furthermore, a still further optical element, e.g., a lens (not explicitly illustrated) can also be provided, which can be configured to concentrate the radiation emitted by the deflecting element 7 and semiconductor chip 1.

In a further step, the semiconductor chip 1 and the deflecting element 7 are arranged on the carrier 11 or are arranged with respect to each other. The arrangement is effected such that the first lateral surface 8A of the deflecting element 7 faces the lateral surface 4 of the semiconductor chip 1.

For this purpose, the semiconductor chip 1 can be introduced into the deflecting element 7 formed in a frame-like manner, in order to establish a form-fitting connection between the deflecting element 7 and semiconductor chip 1. In this case, the use of a connecting means, e.g., an adhesive, is superfluous.

As an alternative thereto, the semiconductor chip 1 can be introduced into the frame-like deflecting element 7, wherein the connecting layer 12 is arranged between the deflecting element 7 and semiconductor chip 1, in order to establish a firmly bonded connection between the deflecting element 7 and semiconductor chip 1. The connecting layer 12 can be attached to the first lateral surface 8A of the deflecting element 7 or to the lateral surface 4 of the semiconductor chip 1, for example, before the semiconductor chip 1 is inserted or introduced into the deflecting element 7. For example, the respective lateral surface 8A, 4 can be coated with adhesive. However, the connecting layer 12 can also be introduced between the semiconductor chip 1 and deflecting element 7 after the semiconductor chip 1 is introduced into the deflecting element 7.

As an alternative thereto, if the deflecting element 7 is not formed in a frame-like manner, the deflecting element 7 can be attached to the semiconductor chip 1 using the connecting layer 12, in that the connecting layer 12 is attached to the first lateral surface 8A and/or partial regions of the lateral surface 4 of the semiconductor chip 1. Then, the lateral surfaces 8A, 4 are brought into contact with each other.

In a further step, the wavelength conversion element 5 is arranged in the beam path of the radiation 6 emitted by the semiconductor chip 1 and the deflecting element 7. In particular, the wavelength conversion element 5 is arranged so that it faces the top side 9 of the deflecting element 7 and the top side 2 of the semiconductor chip 1.

Figure 4:
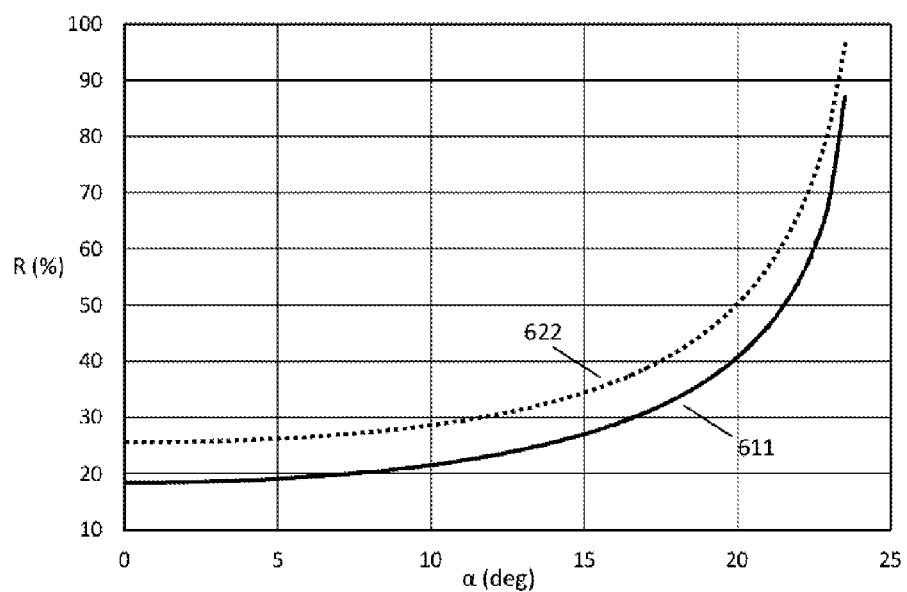
FIG. 4 shows exemplary reflection probabilities at the lateral surfaces of a further exemplified embodiment of an optoelectronic semiconductor device described herein.

FIG. 4 illustrates a first and a second calculated first order reflection probability 611, 622 at the boundary surface to the air surrounding the optoelectronic semiconductor device for two exemplified embodiments of an optoelectronic semiconductor device described herein as a function of the angle of incidence α at the lateral surface of the semiconductor chip. The first reflection probability 611 is calculated for an exemplified embodiment of an optoelectronic semiconductor device described in conjunction with FIG. 1, and the second reflection probability 622 is calculated for an exemplified embodiment described in conjunction with FIG. 2. The first reflection probability 611 accordingly demonstrates the probability for a deflection of laterally exiting radiation 6 at the lateral surface 4 of a semiconductor chip 1 in which a deflecting element 7 is not provided. The second reflection probability 622 demonstrates the probability for a deflection of laterally exiting radiation 6 at the lateral surface 8B of a deflecting element 7.

For the calculation of the second reflection probability 622, it was assumed that a reflective layer is not arranged on the lateral surface 8B of the deflecting element 7. The laterally exiting radiation 6 thus experiences only two refractive index jumps, the first refractive index jump taking place at the boundary surface from the semiconductor chip 1 to the deflecting element 7, which surface is formed by the lateral surface 4 of the semiconductor chip 1, and the second refractive index jump taking place at the boundary surface from the deflecting element 7 to the surrounding air, which surface is formed by the lateral surface 8B of the deflecting element 7. It was further assumed for the calculation that the materials used are dielectrics, in which substantially no absorption of the electromagnetic radiation occurs. A value of n=2.6 was assumed for the refractive index of the material of the semiconductor chip 1, whilst the refractive index of the material of the deflecting element 7 was selected to be 10% greater. The angle of incidence α is only plotted to a value of 23° since with a refractive index of n=2.6 at the transition to air, total reflection occurs from an angle of incidence of α=23.58°. For angles of incidence α above this value, the reflection probability 611, 622 is thus 100%. Only first order calculations are performed. This means that effects produced by a multiple reflection of the laterally exiting radiation 6 at the lateral surface 8B of the deflecting element 7 and/or the lateral surface 4 of the semiconductor chip 1, have not been considered. Such effects would not substantially influence the result.

Both reflection probabilities 611, 622 have the typical curve of reflection probability at the boundary surfaces between two dielectrics. However, the second reflection probability 622 is always greater than the first reflection probability 611. The first reflection probability 611 at small angles of incidence α of up to 40% is hereby increased by up to 40% compared with the second reflection probability 622. However, by selecting the refractive indices of the materials of the deflecting element 7 and/or the semiconductor chip 1 differently, this increase can be significantly above this calculated value.

The higher second reflection probability 622 is supposedly to be accounted for as follows. In the case that a deflecting element 7 is not provided, laterally exiting radiation 7 which impinges upon the lateral surface 4 at an angle of incidence α which is less than the critical angle for total reflection, can be reflected and transmitted at the lateral surface, wherein transmitted, laterally exiting radiation 6 cannot be utilized further. In the case that a deflecting element 7 is provided, the laterally exiting radiation can once more be reflected at the lateral surface 8B of the deflecting element 7. By virtue of the fact that the deflecting element 7 is formed of a material which has a higher refractive index than the material of the semiconductor chip 1, a reduced reflection probability at the lateral surface 4 of the semiconductor chip 1, caused by the now lower refractive index jump at the lateral surface 4 of the semiconductor chip 1, is compensated for by the increased reflection probability at the lateral surface 8B of the deflecting element 7.

The description made with reference to the exemplified embodiments does not restrict the invention to these embodiments. Rather, the invention encompasses any new feature and any combination of features, including in particular any combination of features in the claims, even if this feature or this combination is not itself explicitly indicated in the claims or exemplified embodiments.

The invention claimed is:

1. An optoelectronic semiconductor device comprising:
   a semiconductor chip that emits electromagnetic radiation during operation, wherein the semiconductor chip comprises a lateral surface and a top side facing away from a carrier, and wherein a first portion of the electromagnetic radiation exits through the lateral surface and a second portion of the electromagnetic radiation is outcoupled at the top side during the operation of the semiconductor chip; and
   a radiation-transmissive deflecting element arranged next to the lateral surface of the semiconductor chip, wherein the deflecting element comprises a material whose refractive index is higher than an average refractive index of a semiconductor material of the semiconductor chip, wherein the deflecting element does not cover the top side of the semiconductor chip.

2. The optoelectronic semiconductor device according to claim 1, wherein the deflecting element is formed in one piece, and wherein the deflecting element is arranged circumferentially on the lateral surface of the semiconductor chip.

3. The optoelectronic semiconductor device according to claim 1, wherein the deflecting element comprises a first lateral surface facing the lateral surface of the semiconductor chip and a second lateral surface arranged opposite to the first lateral surface, and wherein the semiconductor chip is formed such that the first portion of the radiation that has exited the lateral surface of the semiconductor chip enters into the deflecting element via the first lateral surface.

4. The optoelectronic semiconductor device according to claim 3, wherein the deflecting element is formed and arranged such that the radiation that has entered the deflecting element is completely or partially prevented from exiting the second lateral surface of the deflecting element.

5. The optoelectronic semiconductor device according to claim 3, wherein the deflecting element comprises a top side facing away from the carrier, and wherein the deflecting element is formed and arranged such that the first portion of the radiation which is emitted by the semiconductor chip and has entered the deflecting element is outcoupled at the top side of the deflecting element.

6. The optoelectronic semiconductor device according to claim 5, wherein the top side of the deflecting element has a structuring, and wherein the first and second lateral surfaces of the deflecting element are formed smoother than the top side of the deflecting element.

7. The optoelectronic semiconductor device according to claim 3, wherein the top side of the semiconductor chip has a structuring.

8. The optoelectronic semiconductor device according to claim 7, further comprising a wavelength conversion element, wherein the wavelength conversion element is configured for at least partially converting the radiation exiting the top side of the semiconductor chip and the radiation exiting the top side of the deflecting element into an electromagnetic secondary radiation.

9. The optoelectronic semiconductor device according to claim 1, wherein the deflecting element is arranged immediately adjacent the lateral surface of the semiconductor chip.

10. The optoelectronic semiconductor device according to claim 1, further comprising a connecting layer arranged between the deflecting element and the semiconductor chip, wherein the connecting layer comprises a material whose refractive index is less than or equal to the refractive index of the material of the semiconductor chip, and wherein the refractive index of the material of the connecting layer is less than the refractive index of the material of the deflecting element.

11. The optoelectronic semiconductor device according to claim 1, wherein the deflecting element comprises a first lateral surface facing the lateral surface of the semiconductor chip and a second lateral surface arranged opposite to the first lateral surface, wherein the deflecting element comprises a bottom side facing the carrier, and wherein a reflecting layer is arranged between the bottom side of the deflecting element and the carrier and/or on the second lateral surface of the deflecting element.

12. The optoelectronic semiconductor device according to claim 1, wherein the semiconductor chip comprises GaN, and wherein the deflecting element comprises $TiO_2$, $TeO_2$ or InGaN.

13. The optoelectronic semiconductor device according to claim 1, wherein a vertical extent of the deflecting element is substantially the same as a vertical extent of the semiconductor chip, wherein the deflecting element is configured to deflect the radiation generated by the semiconductor chip that exits from the lateral surface of the semiconductor chip at which the deflecting element is arranged, and wherein the deflecting element covers the lateral surfaces of the semiconductor chip at least in parts.

14. The optoelectronic semiconductor device according to claim 1, further comprising a wavelength conversion element, wherein the wavelength conversion element is configured for at least partially converting the radiation exiting the top side of the semiconductor chip and radiation exiting a top side of the deflecting element into an electromagnetic secondary radiation, wherein the wavelength conversion element is arranged immediately adjacent the deflecting element and the semiconductor chip.

15. A method for producing an optoelectronic semiconductor device according claim 1, the method comprising:
providing the carrier; and
arranging the semiconductor chip and the deflecting element on the carrier such that a first lateral surface of the deflecting element faces the lateral surface of the semiconductor chip.

16. The method according to claim 15, wherein the deflecting element is formed in a frame-like manner,
wherein the semiconductor chip is introduced into the deflecting element to establish a form-fitting connection between the deflecting element and semiconductor chip, or
wherein the semiconductor chip is introduced into the deflecting element, and wherein a connecting layer is arranged between the deflecting element and the semiconductor chip, in order to establish a firmly bonded connection between the deflecting element and semiconductor chip.

17. A method for producing an optoelectronic semiconductor device according to claim 1, wherein the deflecting element is applied directly to the lateral surface of the semiconductor chip using a coating process.

18. An optoelectronic semiconductor device comprising:
a semiconductor chip configured to emit electromagnetic radiation, wherein the semiconductor chip comprises a lateral surface, and wherein a portion of the electromagnetic radiation exits through the lateral surface during operation of the semiconductor chip; and
a radiation-transmissive deflecting element arranged next to the lateral surface of the semiconductor chip, wherein the deflecting element comprises a material whose refractive index is higher than an average refractive index of a semiconductor material of the semiconductor chip, wherein the deflecting element is formed and arranged such that the radiation which has entered the deflecting element is completely or partially prevented from exiting a second lateral surface of the deflecting element, wherein the deflecting element comprises a first lateral surface facing the lateral surface of the semiconductor chip, the second lateral surface arranged opposite to the first lateral surface and a top side facing away from a carrier, wherein the semiconductor chip is formed such that the portion of the radiation that has exited the lateral surface of the semiconductor chip enters into the deflecting element via the first lateral surface, wherein the deflecting element is formed and arranged such that the portion of the radiation which has entered the deflecting element is outcoupled at the top side of the deflecting element, wherein the top side of the deflecting element has a structuring, and wherein the first and second lateral surfaces of the deflecting element are formed smoother than the top side of the deflecting element.

19. An optoelectronic semiconductor device comprising:
a semiconductor chip configured to emit electromagnetic radiation, wherein the semiconductor chip comprises a lateral surface, and wherein a portion of the electromagnetic radiation exits through the lateral surface during operation of the semiconductor chip; and
a radiation-transmissive deflecting element arranged next to the lateral surface of the semiconductor chip, wherein the deflecting element comprises a material whose refractive index is higher than an average refractive index of a semiconductor material of the semiconductor chip,
wherein a vertical extent of the deflecting element is substantially the same as the vertical extent of the semiconductor chip,
wherein the deflecting element is configured to deflect the radiation generated by the semiconductor chip which exits from the lateral surface of the semiconductor chip at which the deflecting element is arranged,
wherein the deflecting element covers the lateral surfaces of the semiconductor chip at least in parts, wherein the deflecting element comprises a first lateral surface facing the lateral surface of the semiconductor chip and a second lateral surface arranged opposite to the first lateral surface, wherein the first lateral surface and the second lateral surface are arranged parallel to each other, wherein the first lateral surface and the second lateral surface extend perpendicular to a main extension direction of the optoelectronic semiconductor device, and wherein the first and second lateral surfaces of the deflecting element are formed smoother than a top side of the deflecting element.

* * * * *